(12) United States Patent
Miyazaki et al.

(10) Patent No.: US 9,761,530 B2
(45) Date of Patent: Sep. 12, 2017

(54) GRAPHENE WIRING AND METHOD FOR MANUFACTURING THE SAME

(71) Applicant: Kabushiki Kaisha Toshiba, Minato-ku (JP)

(72) Inventors: Hisao Miyazaki, Yokohama (JP); Tadashi Sakai, Yokohama (JP); Yuichi Yamazaki, Inagi (JP); Masayuki Katagiri, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/842,249

(22) Filed: Sep. 1, 2015

(65) Prior Publication Data

US 2016/0086891 A1 Mar. 24, 2016

(30) Foreign Application Priority Data

Sep. 18, 2014 (JP) ................................. 2014-190566

(51) Int. Cl.
  *H01L 23/48* (2006.01)
  *H01L 23/532* (2006.01)
  *H01L 21/768* (2006.01)

(52) U.S. Cl.
  CPC .. *H01L 23/53276* (2013.01); *H01L 21/76834* (2013.01); *H01L 21/76838* (2013.01); *H01L 2924/0002* (2013.01)

(58) Field of Classification Search
  CPC ......... H01L 23/53276; H01L 21/32056; H01L 2924/0002; H01L 257/75; H01L 2224/1354; H01L 2224/2954; H01L 2224/3754; H01L 2224/4554
  See application file for complete search history.

(56) References Cited

U.S. PATENT DOCUMENTS

| | | | |
|---|---|---|---|
| 9,000,591 B2 | 4/2015 | Yamazaki et al. | |
| 9,117,823 B2 | 8/2015 | Yamazaki et al. | |
| 2011/0006425 A1 | 1/2011 | Wada et al. | |
| 2011/0101528 A1 | 5/2011 | Akimoto et al. | |

(Continued)

FOREIGN PATENT DOCUMENTS

| | | |
|---|---|---|
| JP | 2011-23420 | 2/2011 |
| JP | 2011-96980 | 5/2011 |

(Continued)

OTHER PUBLICATIONS

U.S. Appl. No. 14/842,239, filed Sep. 1, 2015, Hisao Miyazaki et al.

(Continued)

*Primary Examiner* — Julio J Maldonado
*Assistant Examiner* — Stanetta Isaac
(74) *Attorney, Agent, or Firm* — Oblon, McClelland, Maier & Neustadt, L.L.P.

(57) ABSTRACT

Graphene wiring of an embodiment has a graphene intercalation compound including a multilayer graphene having graphene sheets stacked therein and an interlayer substance disposed between layers of the multilayer graphene, and an interlayer cross-linked layer connected to a side surface of the multilayer graphene. The interlayer cross-linked layer has a cross-linked molecular structure including multiple bonded molecules cross-linking the graphene sheets included in the multilayer graphene.

11 Claims, 8 Drawing Sheets

(56) References Cited

U.S. PATENT DOCUMENTS

| | | |
|---|---|---|
| 2011/0315655 A1 | 12/2011 | Asano |
| 2012/0080661 A1 | 4/2012 | Saito et al. |
| 2012/0080796 A1 | 4/2012 | Wada et al. |
| 2012/0228614 A1 | 9/2012 | Kitamura et al. |
| 2014/0084250 A1 | 3/2014 | Wada et al. |
| 2014/0117548 A1 | 5/2014 | Katagiri et al. |
| 2014/0231751 A1 | 8/2014 | Wada et al. |
| 2014/0252342 A1* | 9/2014 | Ramadas ............ H01L 21/56 257/40 |
| 2014/0284798 A1 | 9/2014 | Miyazaki et al. |
| 2015/0194386 A1 | 7/2015 | Yamazaki et al. |
| 2016/0086890 A1 | 3/2016 | Miyazaki et al. |

FOREIGN PATENT DOCUMENTS

| | | |
|---|---|---|
| JP | 2012-54303 | 3/2012 |
| JP | 2012-80006 | 4/2012 |
| JP | 2012-80014 | 4/2012 |
| JP | 2012-199305 | 10/2012 |
| JP | 2012-199520 | 10/2012 |
| JP | 2013-58669 | 3/2013 |
| JP | 2013-201373 | 10/2013 |
| JP | 2014-63912 | 4/2014 |
| JP | 2014-86622 | 5/2014 |
| JP | 2014-96411 | 5/2014 |
| JP | 2014-157923 | 8/2014 |
| JP | 2014-183212 | 9/2014 |
| JP | 2016-63095 | 4/2016 |
| WO | WO 2010/122635 A1 | 10/2010 |

OTHER PUBLICATIONS

Weekit Sirisaksoontorn et al. "The Effect of Surface Passivation on the Preparation and Stability of the Graphite Intercalation Compounds Containing Tetra-n-alkylammonium Cations", Carbon, vol. 69, 2014, 6 pages.

Xuerong Zhang et al. "Air Stability and Surface Passivation of Acceptor-Type Graphite Intercalation Compounds", Carbon, vol. 38, 2000, 9 pages.

* cited by examiner

GRAPHENE WIRING AND METHOD FOR MANUFACTURING THE SAME

CROSS-REFERENCE TO RELATED APPLICATION

This application is based upon and claims the benefit of priority from Japanese Patent Application No. 2014-190566, filed on Sep. 18, 2014; the entire contents of which are incorporated herein by reference.

FIELD

Embodiments described herein relate to a graphene wiring and a method for manufacturing the same.

BACKGROUND

As an LSI or a 3D memory is microfabricated and multilayered, an increase in wiring delay is becoming a large problem in metal wiring. It is important to reduce wiring resistance or a capacity between wires in order to reduce the wiring delay. For example, an application of a low-resistance material such as Cu is practically used in order to reduce resistance of the wiring. However, even in the Cu wiring, there are such problems as reliability degradation due to stress migration or electromigration, an increase in electric resistivity caused by a size effect, and embedding into fine via holes. A wiring material having low resistance and excellent current density resistance is demanded.

As a next-generation wiring material which can be expected to have low resistance and high reliability, application of a carbon-based material such as a carbon nanotube or a graphene is attracting attention. The carbon-based material has excellent physical properties such as high current density resistance, electric conductive characteristics, thermal conductivity, and mechanical strength. Particularly, a wiring structure using a graphene in horizontal interlayer wiring is studied. In order to form graphene wiring, a graphene film uniformly formed on a substrate is processed into a wiring shape, or graphene is grown on a catalyst layer formed into a wiring shape. However, when the graphene wiring is as thin as about 10 nm, resistance may increase due to becoming a semiconductor by a quantum confinement effect of an electron or a scattering effect by an edge.

A promising method for reducing the resistance is an intercalation method. In the intercalation method, an interlayer substance is inserted between graphene sheets, and is converted into a graphene intercalation compound. The inserted interlayer substance donates an electron or a hole to the graphene to reduce the resistance. However, the interlayer substance after being subjected to an intercalation treatment may be leaked.

DETAILED DESCRIPTION

Figure 1:
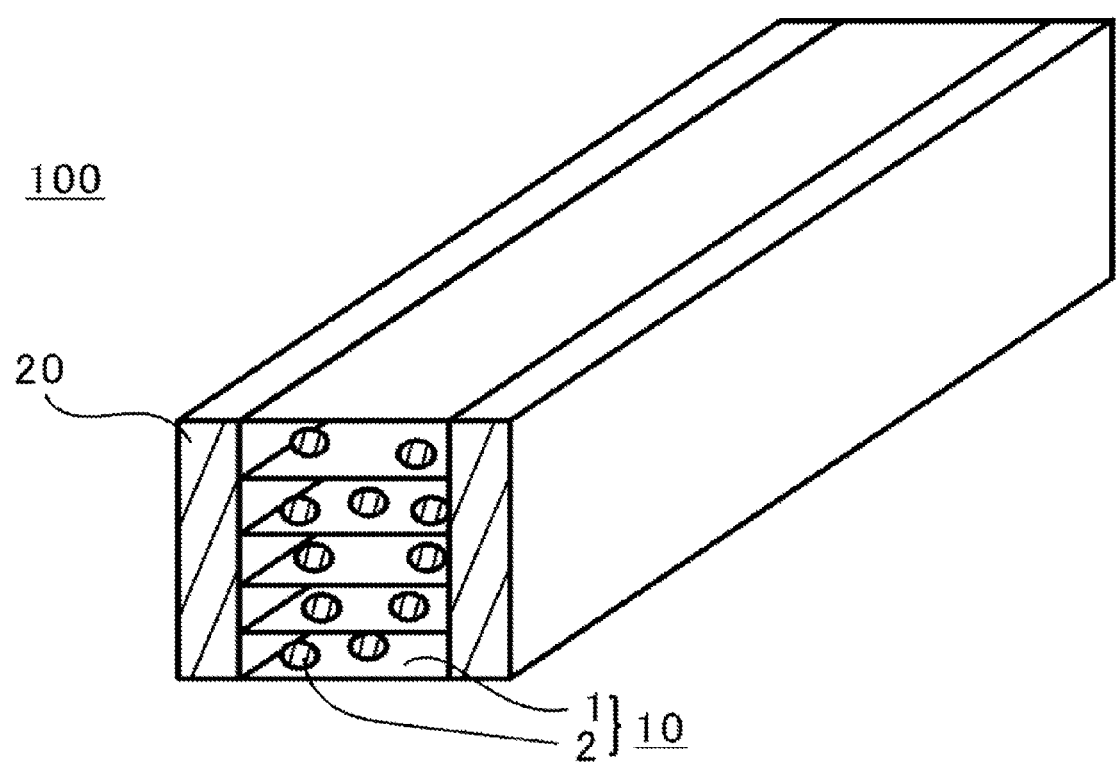
FIG. 1 is a perspective schematic diagram of graphene wiring according to an embodiment.

Graphene wiring of an embodiment has a graphene intercalation compound including a multilayer graphene having graphene sheets stacked therein and an interlayer substance disposed between layers of the multilayer graphene, and an interlayer cross-linked layer connected to a side surface of the multilayer graphene. The interlayer cross-linked layer has a cross-linked molecular structure including multiple bonded molecules cross-linking the graphene sheets included in the multilayer graphene.

A method for manufacturing graphene wiring of an embodiment has forming a multilayer graphene having graphene sheets stacked on a substrate and processed into a wiring pattern shape, connecting a first organic group to a side surface of the graphene sheet in a longitudinal direction, inserting an interlayer substance between layers of the multilayer graphene having the first organic group connected thereto, and connecting the first organic group to a second organic group to cross-link the graphene sheets.

Hereinafter, graphene wiring according to an embodiment and a method for manufacturing the graphene wiring will be described with reference to the drawings as necessary. The size or the like of each component in the drawings is not necessarily the same as that of the real wiring.

FIG. 1 is a perspective diagram of graphene wiring 100 according to the embodiment.

The graphene wiring 100 in FIG. 1 includes a graphene intercalation compound 10 and an interlayer cross-linked layer 20. The graphene intercalation compound 10 includes a multilayer graphene 1 and an interlayer substance 2 disposed between layers of the multilayer graphene 1. The interlayer cross-linked layer 20 is connected to a side surface of the multilayer graphene 1.

The multilayer graphene 1 is a layered substance having planar graphene sheets stacked therein. The graphene sheet of the multilayer graphene 1 is preferably a graphene nanoribbon processed into a wiring pattern shape. The width of the multilayer graphene 1, that is, the wiring width is preferably 3 nm or more and 100 nm or less, more preferably 3 nm or more and 30 nm or less. The length of the multilayer graphene 1 in a longitudinal direction, that is, the wiring length is any value according to a purpose. The layer number of the multilayer graphene 1 is typically two or more and 100 or less. The layer number of the multilayer graphene 1 is preferably three or more and 100 or less. The wiring width, the wiring length, and the layer number of the multilayer graphene 1 can be checked, for example, with a transmission electron microscope (TEM).

The graphene wiring 100 of the embodiment is used for wiring in a semiconductor device or wiring in an electronic circuit. Specifically, the graphene wiring 100 is used for wiring in a semiconductor device such as an integrated circuit (LSI), a central processing unit (CPU), a programmable logic device (PLD), or a memory chip. For example, an edge of the graphene wiring 100 is connected to an electrode of a transistor or a diode, or is connected to a carbon nanotube of longitudinal wiring via a contact plug. The use form of the graphene wiring 100 of the embodiment is not limited to the above-described forms as long as the graphene wiring 100 is used as a conductor.

The multilayer graphene 1 is not particularly limited as long as the multilayer graphene 1 is processed into a wiring pattern shape. Specifically, the multilayer graphene 1 is obtained, for example, by processing multilayer graphene sheets grown from a catalytic film on a substrate into a wiring pattern shape, by growing a catalytic film processed into a wiring pattern shape on a substrate, by transcribing multilayer graphene sheets processed into a wiring pattern shape onto a substrate of a semiconductor device or the like, by tanscribing multilayer graphene sheets onto a substrate of a semiconductor device or the like and then processing the multilayer graphene sheets into a wiring pattern shape, or by processing multilayer graphene sheets into a wiring pattern shape for transcription.

The interlayer substance 2 is included between layers of the multilayer graphene 1. The graphene intercalation compound 10 includes the multilayer graphene 1 and the interlayer substance 2. The interlayer substance 2 is an atom or a molecule to donate a carrier (an electron or a hole) to a graphene sheet. The interlayer substance 2 is at least one atom selected from F, Cl, Br, I, O, S, N, P, Li, Na, K, Rb, Cs, Be, Mg, Ca, Sr, Y, Sc, Ba, Eu, Sm, Yb, Hg, and Tl, or a molecule containing at least one thereof. Specifically, it is possible to use, as the interlayer substance 2, one or more selected from halogen such as $F_2$, $Cl_2$, $Br_2$, or $I_2$, an interhalogen compound such as IBr or ICl, a metal halide such as $FeCl_3$, $CuCl_2$, $BF_4$, or $AsF_5$, an acid such as sulfuric acid, nitric acid, or phosphoric acid, and alkali metal and alkaline earth metal such as Li, Na, K, Mg, or Ca. The interlayer substance 2 can be checked by an analysis with a scanning electron microscope including an energy dispersive X-ray spectroscopic analyzer (SEM-EDX).

The interlayer distance of the multilayer graphene 1 itself is 0.335 nm. However, by disposing the interlayer substance 2 between the layers of the graphene sheets, the interlayer distance of the multilayer graphene 1 becomes larger than 0.335 nm. The interlayer distance (average value) of the multilayer graphene 1 including the interlayer substance 2 between the layers thereof depends on a kind and an interlayer abundance ratio of the interlayer substance 2, but is typically 0.7 nm to 1.0 nm.

A side surface of the multilayer graphene 1 is connected to the interlayer cross-linked layer 20. The side surface connected to the interlayer cross-linked layer 20 is a side surface of the multilayer graphene 1 in a longitudinal direction, that is, a surface formed of an edge. The side surface in a longitudinal direction and the interlayer cross-linked layer 20 facing each other are preferably connected to each other. The interlayer cross-linked layer 20 is disposed at least in a part of stacked surfaces. A metal film, a compound film, or the like may be formed on a stacked surface not having the interlayer cross-linked layer 20 disposed thereon. A part of the stacked surfaces may be connected to other wiring. The interlayer cross-linked layer 20 is disposed on one side surface or both side surfaces of the multilayer graphene 1.

Figure 2:
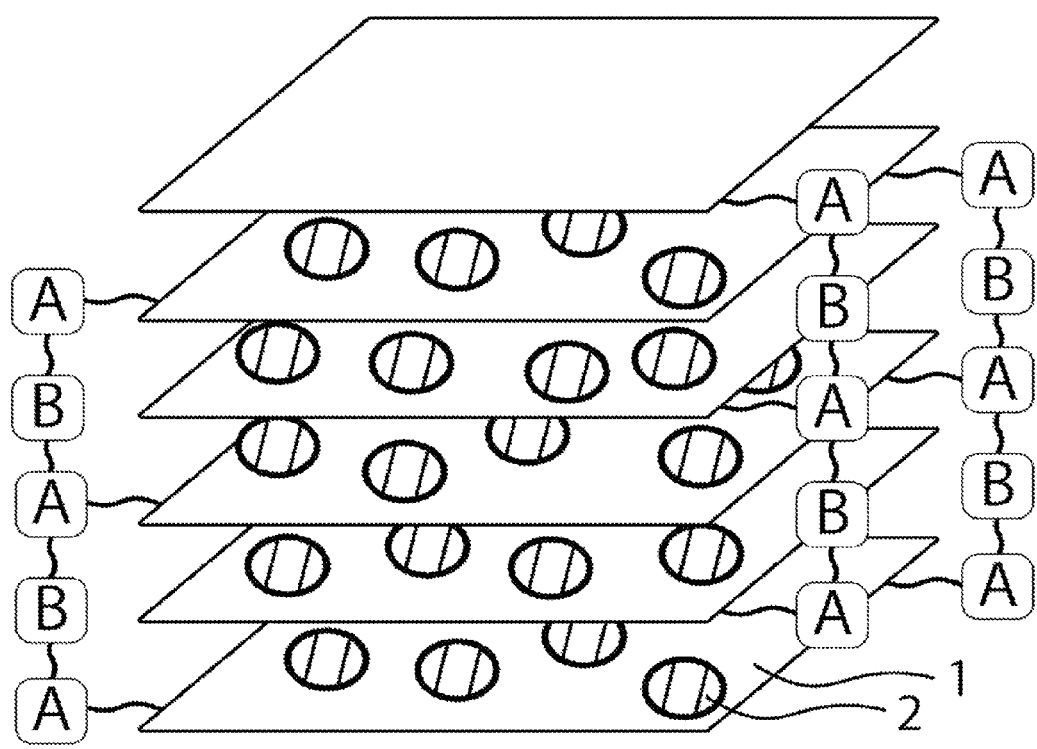
FIG. 2 is a schematic diagram of the graphene wiring according to the embodiment.

The interlayer cross-linked layer 20 has a cross-linked molecular structure including two or more bonded molecules cross-linking a plurality of graphene sheets included in the multilayer graphene 1. The cross-linked molecular structure includes at least an organic compound structure. The interlayer cross-linked layer 20 is a reaction product by a reaction of an organic molecule. The cross-linked molecular structure is formed after the interlayer substance 2 is inserted. There is an advantage that the cross-linked molecular structure can be formed in such mild conditions that the interlayer substance 2 is hardly leaked due to an organic reaction. As illustrated in the schematic diagram in FIG. 2, the cross-linked molecular structure of the interlayer cross-linked layer 20 includes a first organic group A and a second organic group B. The graphene sheets are cross-linked to each other by the cross-linked molecular structure in which a functional group included in the first organic group A connected to the graphene and the second organic group B are connected to each other.

The interlayer cross-linked layer 20 may cross-link a graphene sheet in the multilayer graphene 1 to a graphene sheet just above or just below the graphene sheet. Alternatively, the interlayer cross-linked layer 20 may cross-link a graphene sheet to a graphene sheet two or more sheets above or below the graphene sheet. The layer number of the graphene sheets cross-linked by the cross-linked molecular structure is two or more as described above. However, the layer number can be determined by adjusting a molecular length in the cross-linked molecular structure.

First, the first organic group A containing a functional group and connected to the graphene will be described. The first organic group A is connected to a functional group on an edge of the graphene on a side surface of the multilayer graphene 1. The functional group on an edge of the graphene is preferably a group which can be easily introduced to an edge of the graphene and has high reactivity, such as a hydroxyl group. In order to form the cross-linked molecular structure with the second organic group B, the first organic group A preferably includes, for example, a hydroxyl group or an ester group as a functional group to be connected to the second organic group B. The first organic group A preferably includes one or more, preferably two or more functional groups to be connected to the second organic group B. In the schematic diagram in FIG. 2, the first organic group A includes a plurality of functional groups to be connected to the two second organic groups B. At least some of the first organic groups A are connected to the two second organic groups B. Therefore, the cross-linked molecular structure can cross-link three or more layers of the graphene sheets. In the schematic diagram in FIG. 2, the three first organic groups A are connected to the two second organic groups B. However, the connection number is not limited to that illustrated in FIG. 2, and may be more or less than that illustrated in FIG. 2.

The second organic group B is connected to the first organic group A, and cross-links the layers of the graphene sheets. The first organic group A is chemically bonded and connected to the second organic group B. The first organic group A is selectively connected to the second organic group B. Therefore, the connected structure includes a bonded structure formed by, for example, a dehydration condensation reaction or a transesterification reaction. Examples of the bonded structure include an ester.

Figure 3:
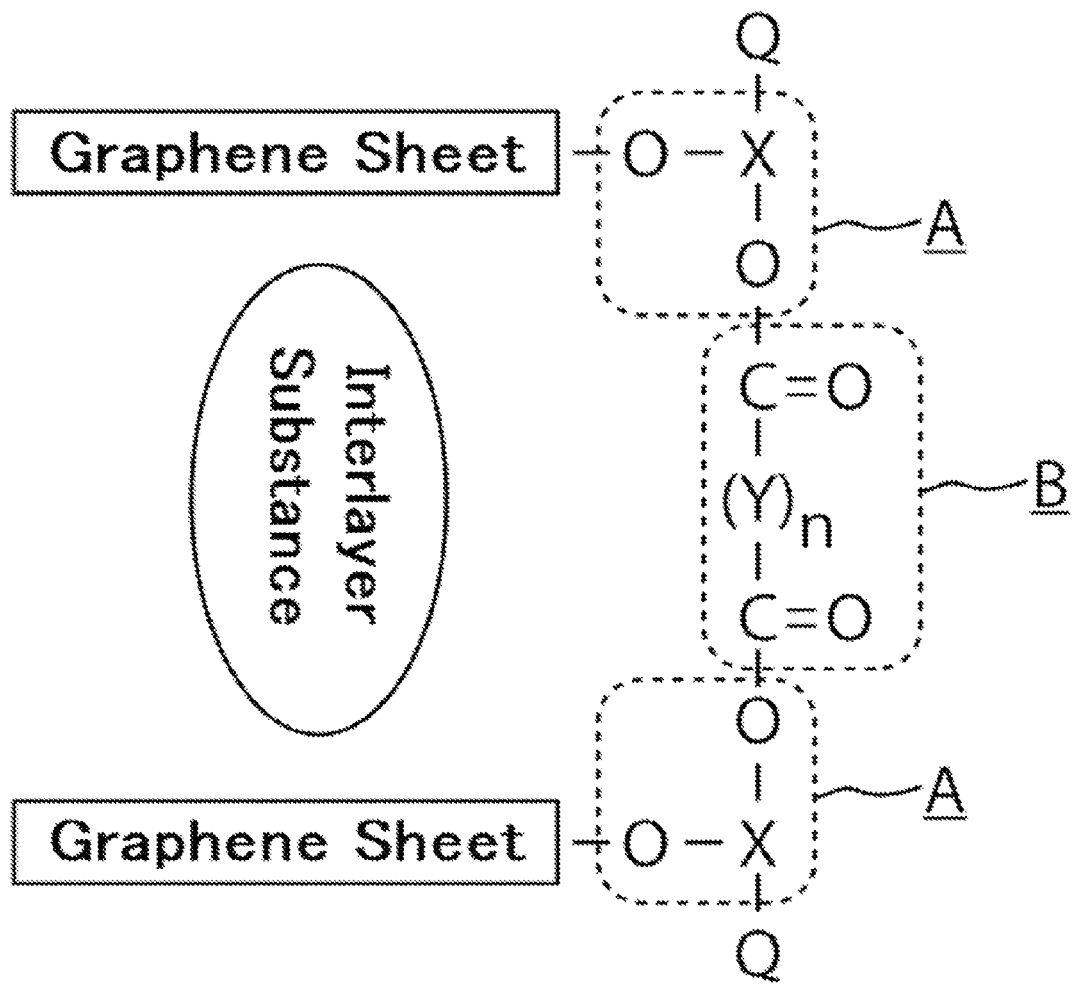
FIG. 3 is a schematic diagram of the graphene wiring according to the embodiment.

The schematic diagram in FIG. 3 illustrates a cross-linked molecular structure of the graphene wiring 100 of the embodiment. In FIG. 3, the graphene sheets are cross-linked to each other with the first organic group A and the second organic group B. In FIG. 3, a reference sign of the organic group is underlined to distinguish between the reference sign and a chemical symbol. The first organic group A is connected to the graphene sheet, Q, and the second organic group B. The cross-linked molecular structure in FIG. 3 can be represented by graphene sheet-O—X—O—CO—(Y)$_n$—CO—O—X—O-graphene sheet (O represents oxygen and CO represents carbonyl).

Q preferably includes any one selected from a hydrogen atom, a hydroxyl group, an alkyl chain having one or more and five or less carbon atoms, and the second organic group B.

X in the first organic group A preferably includes an alkyl chain having one or more and five or less carbon atoms. Q and O (oxygen) are each bonded to any carbon atom in the alkyl chain.

Y in the second organic group B preferably includes any structure of alkane, alkene, and benzene. Y may include a side chain having three or less carbon atoms. The number n of repeating unit of Y is preferably 1 or more and 20 or less. A suitable number is appropriately selected in accordance with the interlayer distance of the graphene sheets after the interlayer substance 2 is inserted.

Figure 4:
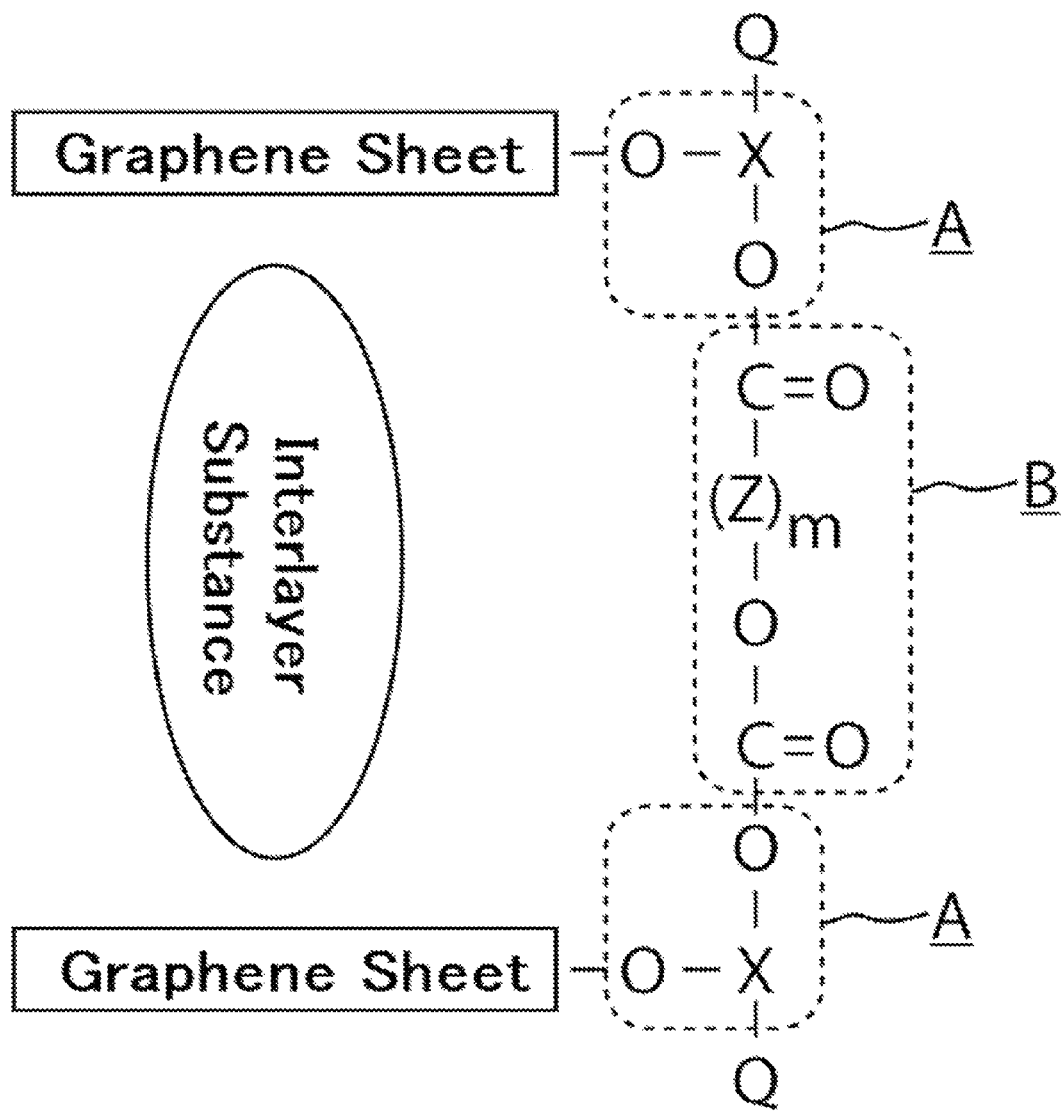
FIG. 4 is a schematic diagram of the graphene wiring according to the embodiment.

The schematic diagram in FIG. 4 illustrates a cross-linked molecular structure of the graphene wiring 100 of an embodiment different from that in FIG. 3. In FIG. 4, the graphene sheets are cross-linked to each other with the first organic group A and the second organic group B. In FIG. 4, a reference sign of the organic group is underlined to distinguish between the reference sign and a chemical symbol. The first organic group A is connected to the graphene sheet, Q, and the second organic group B. The cross-linked molecular structure illustrated in FIG. 4 is similar to that in FIG. 3 except that the second organic group B is different from the second organic group B illustrated in the cross-linked molecular structure in FIG. 3. Parts of the cross-linked molecular structure illustrated in FIG. 4 common to that in FIG. 3 will not be described. The cross-linked molecular structure shown in FIG. 3 can be represented by graphene sheet-O—X—O—CO—(Z)$_m$—O—CO—O—X—O-graphene sheet (O represents oxygen and CO represents carbonyl).

Z in the second organic group B preferably includes a siloxane structure represented by (OSiR$_1$R$_2$). R$_1$ and R$_2$ each preferably include a hydrogen atom or an alkyl group having three or less carbon atoms. The number m of repeating unit of Z is preferably 1 or more and 20 or less.

Figure 5:
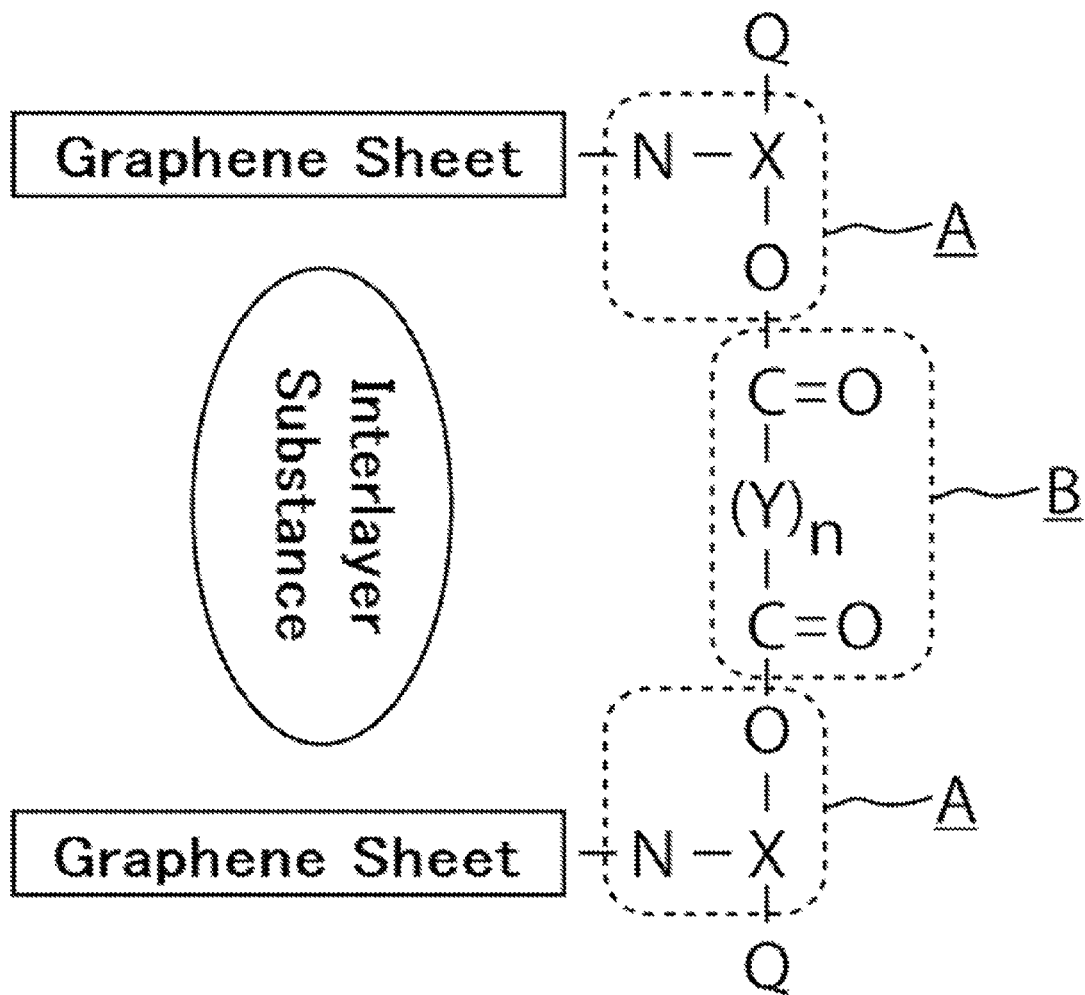
FIG. 5 is a schematic diagram of the graphene wiring according to the embodiment.

The schematic diagram in FIG. 5 illustrates a cross-linked molecular structure of the graphene wiring 100 of an embodiment different from that in FIG. 3. In FIG. 5, the graphene sheet is connected to the first organic group A not via an oxygen atom but via a nitrogen atom. The cross-linked molecular structure illustrated in FIG. 5 is similar to that in FIG. 3 except that the first organic group A is different from the first organic group A illustrated in the cross-linked molecular structure in FIG. 3. Parts of the cross-linked molecular structure illustrated in FIG. 5 common to that in FIG. 3 will not be described. The cross-linked molecular structure in FIG. 3 can be represented by graphene sheet-N—X—O—CO—(Y)$_n$—CO—O—X—N-graphene sheet (O represents oxygen, N represents nitrogen, and CO represents carbonyl). As examples of the connection between the graphene sheet and the first organic group A, connection via an oxygen atom (FIG. 3) and connection via a nitrogen atom (FIG. 5) are illustrated. However, connection via a carbonyl group or the like is not excluded. The connection between the graphene sheet and the first organic group A is not particularly limited as long as the connection is made by an addition reaction, a substitution reaction, a condensation reaction, or the like.

Next, a method for manufacturing the graphene wiring 100 of the embodiment will be described.

The method for manufacturing the graphene wiring 100 of the embodiment includes a process (first process) of forming a multilayer graphene having graphene sheets stacked on a substrate and processed into a wiring pattern shape, a process (second process) of connecting a first organic group to a side surface of a graphene sheet in a longitudinal direction, a process (third process) of inserting an interlayer substance between layers of the multilayer graphene having the first organic group connected thereto, and a process (fourth process) of connecting the first organic group to a second organic group to cross-link the graphene sheets. Hereinafter, the manufacturing method will be described with reference to the schematic diagrams of processes in the method for manufacturing the graphene wiring of the embodiment, illustrated in FIGS. 6 to 8. The manufacturing method described below is a manufacturing method to obtain the cross-linked molecular structure in FIG. 3. The first organic group is connected to the second organic group by a transesterification reaction. An organic group to be used and a preliminary treatment may be appropriately selected to obtain other cross-linked molecular structures. The first organic group A is preferably connected to the second organic group B by a transesterification reaction or a dehydration condensation reaction. In the dehydration condensation reaction, an alcohol containing the second organic group B is preferably used for the reaction in place of an ester containing the second organic group B.

First, the first process of forming the multilayer graphene 1 processed into a wiring pattern shape on a substrate will be described. When the multilayer graphene 1 processed into a wiring pattern shape is formed on a substrate, for example, the following methods are used. That is, after a multilayer graphene is formed on a substrate, the multilayer graphene is processed into a wiring pattern shape to form the multilayer graphene 1 processed into a wiring pattern shape. Alternatively, the multilayer graphene 1 processed into a wiring pattern shape is transcribed onto a substrate. The method for forming a multilayer graphene on a substrate is as follows. That is, a multilayer graphene manufactured in advance for transcription is transcribed onto a substrate. Alternatively, a catalytic film made of nickel or the like is formed on a substrate, hydrocarbon gas is supplied thereto, and a multilayer graphene can be formed by a chemical vapor deposition method. A catalytic film may be formed in accordance with a wiring pattern in advance, and a multilayer graphene may be formed on the catalytic film to thereby form the multilayer graphene 1 processed into a wiring pattern shape. As the method for processing the multilayer graphene into a wiring pattern shape, a well-known lithography technology or the like can be used. The layer number and the wiring shape of the multilayer graphene 1 are adjusted in this process. When a metal film or a compound film is partly formed on a side surface of the multilayer graphene 1 in a longitudinal direction, the metal film or the compound film is preferably formed between the first process and the second process.

Figure 6:
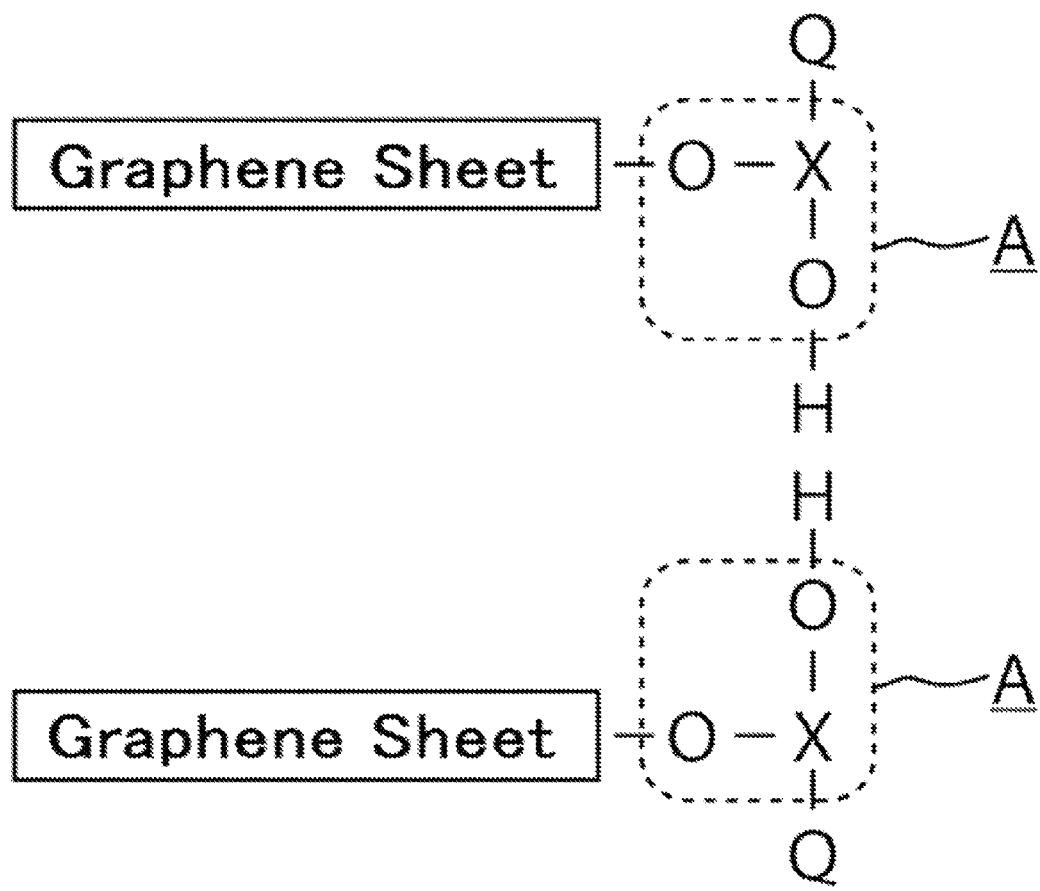
FIG. 6 is a schematic diagram of a process in a method for manufacturing the graphene wiring according to the embodiment.

Next, the second process of connecting the first organic group to a side surface of the multilayer graphene in a longitudinal direction will be described. FIG. 6 illustrates a schematic diagram of a process of introducing the first organic group A to an edge (side surface) of a graphene sheet included in the multilayer graphene 1.

Before the first organic group A is connected to a side surface of a graphene sheet in a longitudinal direction, an oxygen atom may be additionally introduced to a carbon atom on an edge of a graphene sheet included in the multilayer graphene 1. A graphene has a stable carbon skeleton structure except for a defect. Therefore, in order to introduce an organic group, a functional group is preferably introduced to the carbon atom on the edge. In FIG. 6, a hydroxyl group is introduced. However, a group to be introduced is not limited to the hydroxyl group. A carboxyl group or the like may be introduced to the carbon atom on the edge. Any one or more functional groups such as a hydroxyl group or a carboxyl group are selected appropriately in accordance with a functional group of an organic group to be introduced. In this process, the introduction of the organic group is described using a silane coupling agent as an example. Therefore, a hydroxyl group is introduced to the carbon atom on the edge. A hydroxyl group or the like may be introduced to the carbon atom on the edge by etching performed when a wiring pattern of the multilayer graphene 1 is formed. This process may be omitted.

Examples of a method for introducing a hydroxyl group or a carboxyl group to the carbon atom on the edge include a method for treating the multilayer graphene 1 with potassium chlorate and fuming nitric acid, a method for treating the multilayer graphene 1 with sulfuric acid, sodium nitrate, and potassium permanganate, a method for treating the multilayer graphene 1 with concentrated sulfuric acid, a method for treating the multilayer graphene 1 with a piranha solution, and a method for treating the multilayer graphene 1 with oxygen plasma. In any treatment described above, the carbon atom on the edge is easily oxidized because an outer side (edge) of the graphene sheets includes more defects in the skeleton structure than an inner side thereof. When surfaces of the stacked graphene sheets, a metal film, a semiconductor device, or the like is damaged in these treatments, in order to protect these from an acid treatment, parts other than the side surface of the multilayer graphene 1 in a longitudinal direction may be protected using a mask for thin line (wiring) patterning.

In the process illustrated in FIG. 6, a compound containing the first organic group A is reacted with a carbon atom on an edge of a graphene sheet. This reaction is, for example, a nucleophilic reaction or a condensation reaction. The hydroxyl group or the carboxyl group on the edge of the graphene sheet may partly remain without reacting with the compound containing the first organic group A.

Figure 7:
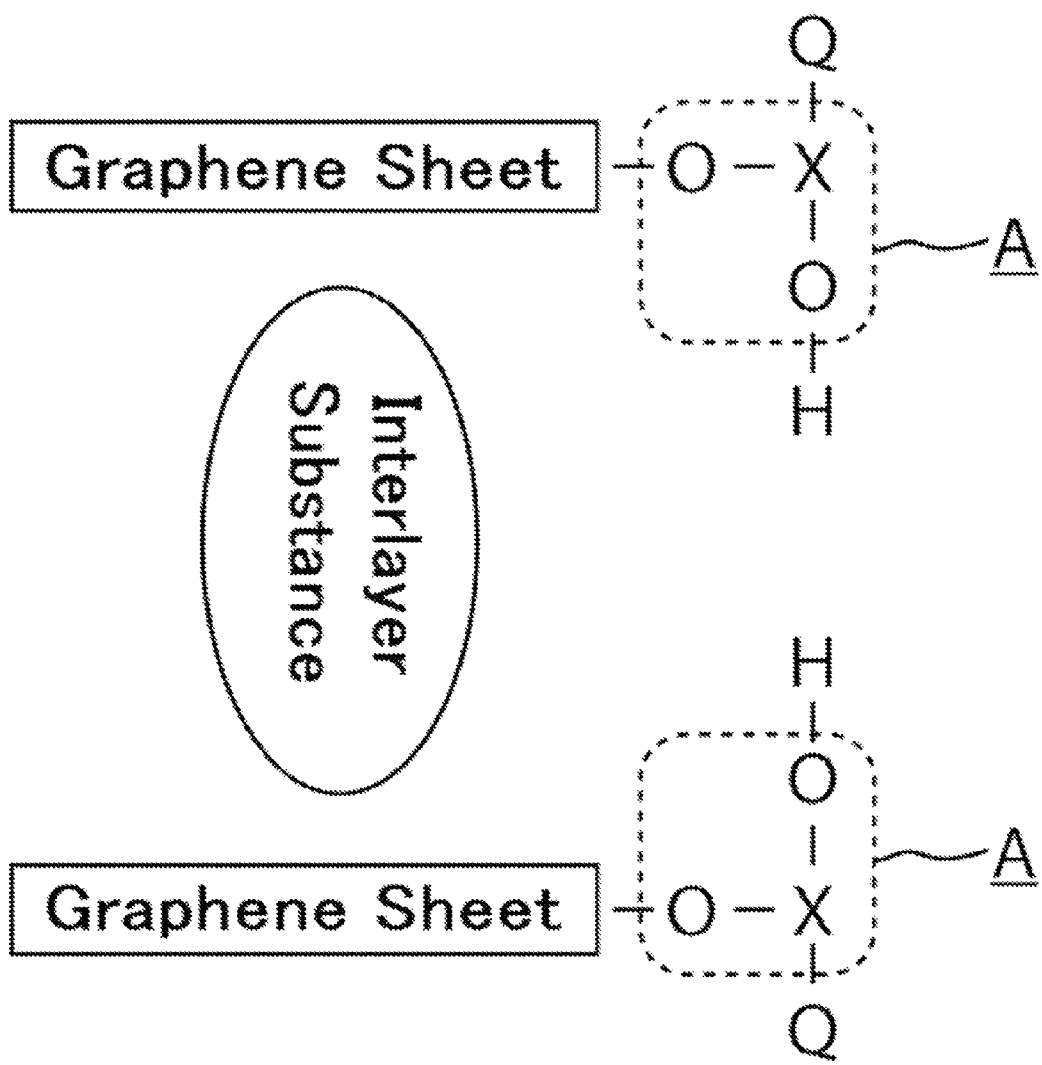
FIG. 7 is a schematic diagram of a process in the method for manufacturing the graphene wiring according to the embodiment.

Next, the third process of inserting the interlayer substance 2 between the layers of the multilayer graphene 1 having the interlayer cross-linked layer 20 formed therein. FIG. 7 illustrates a schematic diagram of a process of inserting the interlayer substance 2 between the layers of the multilayer graphene 1. The interlayer substance 2 is inserted between the layers of the multilayer graphene 1 with a gas atmosphere including at least one atom of F, Cl, Br, I, O, S, N, P, Li, Na, K, Rb, Cs, Be, Mg, Ca, Sr, Y, Sc, Ba, Eu, Sm, Yb, Hg, and Tl, or a molecule containing at least one thereof. This treatment is preferably performed by heating because the interlayer substance 2 is sometimes hardly inserted between the layers of the multilayer graphene 1 due to steric hindrance of the first organic group A.

Figure 8:
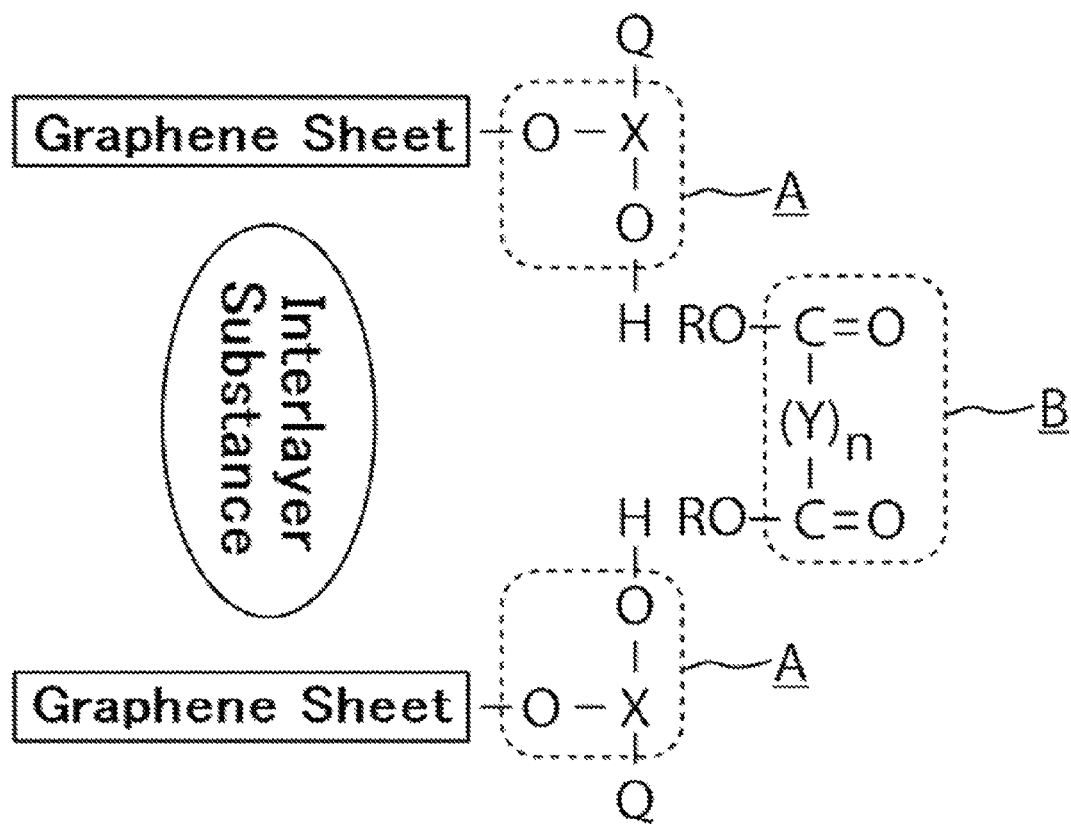
FIG. 8 is a schematic diagram of a process in the method for manufacturing the graphene wiring according to the embodiment.

Next, the fourth process of connecting the first organic group to the second organic group to cross-link the multilayer graphene will be described. FIG. 8 illustrates a schematic diagram of a process of connecting the first organic group A to the second organic group B. FIG. 8 is a schematic diagram illustrating a transesterification reaction between a compound (ester) including the second organic group B and the first organic group A. A hydroxyl group in the first organic group A approaches the ester including the second organic group B to cause a transesterification reaction with generation of an alcohol. The graphene wiring including the cross-linked molecular structure illustrated in the schematic diagram in FIG. 3 is obtained. This reaction is an equilibrium reaction. Therefore, the reaction is preferably performed while the generated alcohol is removed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. Graphene wiring comprising:
a graphene intercalation compound including a multilayer graphene having graphene sheets stacked therein and an interlayer substance disposed between layers of the multilayer graphene; and
an interlayer cross-linked layer connected to a side surface of the multilayer graphene, wherein
the interlayer cross-linked layer has a cross-linked molecular structure including multiple bonded molecules cross-linking the graphene sheets included in the multilayer graphene,
the graphene interlayer compound extends to a wiring direction,
the cross-linked molecular structure connects chemically with edges of the graphene sheets, and
the graphene sheets are bridged at the edges of the graphene sheets by the interlayer cross-linked layer.

2. The wiring according to claim 1, wherein
the cross-linked molecular structure includes at least one of alkane, alkene, and benzene.

3. The wiring according to claim 1, wherein
the cross-linked molecular structure cross-links three or more layers of the graphene sheets.

4. The wiring according to claim 1, wherein
the interlayer substance includes at least one element of F, Cl, Br, I, O, S, N, P, Li, Na, K, Rb, Cs, Be, Mg, Ca, Sr, Y, Sc, Ba, Eu, Sm, Yb, Hg, and Tl.

5. The wiring according to claim 1, wherein
the width the multilayer graphene is 3 nm or more and 100 nm or less.

6. The wiring according to claim 1, wherein
the width the multilayer graphene is 3 nm or more and 30 nm or less.

7. The wiring according to claim 1, wherein
the cross-linked molecular structure includes first organic groups and second organic groups, and
the first organic groups and the second organic groups are connected to each other.

8. The wiring according to claim 7, wherein the first organic groups are connected to the graphene sheets, and
the second organic groups are connected to the first organic groups to cross-link the graphene sheets.

9. The wiring according to claim 7, wherein the first organic group includes one or more functional groups connected to the second organic group.

10. The wiring according to claim 1, wherein the graphene sheets stacked are planar graphene sheets stacked.

11. The wiring according to claim 1, wherein a stacking direction of the graphene sheets is perpendicular to the wiring direction.

* * * * *